United States Patent
Baur et al.

(10) Patent No.: US 8,479,070 B2
(45) Date of Patent: Jul. 2, 2013

(54) INTEGRATED CIRCUIT ARRANGEMENT FOR TEST INPUTS

(75) Inventors: Ulrich Baur, Boeblingen (DE); Lawrence D. Curley, Endwell, NY (US); Ronald J. Frishmuth, Poughkeepsie, NY (US); Ralf Ludewig, Schoenaich (DE); Ching L. Tong, Highland Mills, NY (US); Tobias Webel, Schwaebisch-Gmuend (DE)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 12/822,287

(22) Filed: Jun. 24, 2010

(65) Prior Publication Data

US 2011/0320898 A1    Dec. 29, 2011

(51) Int. Cl.
  *G01R 31/28* (2006.01)
(52) U.S. Cl.
  USPC ............. 714/734; 714/733; 714/25; 714/724; 324/527; 324/750.3; 324/754.01; 324/762.01; 324/719; 324/724
(58) Field of Classification Search
  None
  See application file for complete search history.

(56) References Cited

U.S. PATENT DOCUMENTS

| | | | |
|---|---|---|---|
| 5,870,411 A | 2/1999 | Durham et al. | |
| 6,446,229 B1 | 9/2002 | Merrick et al. | |
| 6,519,724 B1 | 2/2003 | Arnould | |
| 6,920,597 B2 | 7/2005 | Rinderknecht et al. | |
| 6,938,225 B2 * | 8/2005 | Kundu | 714/727 |
| 7,299,389 B2 * | 11/2007 | Nishida et al. | 714/724 |
| 7,519,881 B2 | 4/2009 | Farnworth et al. | |
| 7,562,275 B2 | 7/2009 | Juhn | |
| 7,584,384 B2 | 9/2009 | Russell | |
| 7,646,210 B2 | 1/2010 | Cheng et al. | |
| 7,904,770 B2 * | 3/2011 | Toms | 714/724 |
| 2004/0268193 A1 * | 12/2004 | Nishida et al. | 714/724 |
| 2005/0193302 A1 * | 9/2005 | Arguelles et al. | 714/733 |
| 2006/0053358 A1 | 3/2006 | Russell | |
| 2006/0156114 A1 * | 7/2006 | Mizuhashi et al. | 714/724 |
| 2008/0180116 A1 * | 7/2008 | Fujiwara et al. | 324/754 |
| 2009/0172819 A1 | 7/2009 | Pruden et al. | |
| 2009/0319841 A1 | 12/2009 | Eustis et al. | |
| 2010/0013510 A1 * | 1/2010 | Fujiwara et al. | 324/763 |

* cited by examiner

*Primary Examiner* — John Trimmings
(74) *Attorney, Agent, or Firm* — Cantor Colburn LLP; William A. Kinnaman, Jr.

(57) ABSTRACT

An integrated circuit chip includes a mainline function logic path communicatively connected to a first input/output (I/O) pin, a test logic path communicatively connected to the first I/O pin, a latch disposed between the communicative connection between the test logic function path and the first I/O pin, a second I/O pin communicatively connected to the latch, the second I/O pin operative to send a signal operative to change a state of the latch.

16 Claims, 2 Drawing Sheets

INTEGRATED CIRCUIT ARRANGEMENT FOR TEST INPUTS

BACKGROUND

The present invention relates to integrated circuits, and more specifically, to an arrangement of an integrated circuit with testing inputs.

Many integrated circuit chips include specialized test patterns and test logic structures that are used to verify internal chip logic circuits. The test patterns are used in a "testing mode" and the structures are controlled by chip test input/output (I/O) pins also known as c4s. In many VLSI chips, c4s are designed to be "bi-directional", meaning they support a path into the chip, as well as a path out of the chip. Each c4 may be configured as an input OR an output (not both), depending on the desired function for each c4 by "personalizing" the c4 using hard wired tie values (tie to '1' or tie to '0') when the chip is designed. The value of the tie enables only the direction (into or out of the chip) the c4 is intended to be used in this chip application. The reverse path is disabled.

In testing, the internal latch and array states are assumed to be unknown or indeterminate at the start of testing. Because of the unknown state of latches in the chip at the beginning of a test, the chips are typically designed such that no latches are disposed between a c4 pin and the test logic structures. An un-initialized latch in the path between a c4 pin and the test logic structures could render the chip untestable.

The designed packaging constraints of chips often limit the number of dedicated test c4 pins that are fabricated on the chip. Shared test I/Os may be used to conserve space on a chip. The shared test I/Os are pins that function as a c4 testing pin during a testing mode, and as mainline function pins during mainline chip functions (non-testing or normal chip operation modes). The use of shared test I/Os may result in logic paths from the shared test I/Os that include undesirable logic loops. The undesirable logic loops create the potential for fundamental logic design rules to be broken.

BRIEF SUMMARY

According to one embodiment of the present invention, an integrated circuit chip includes a mainline function logic path communicatively connected to a first input/output (I/O) pin, a test logic path communicatively connected to the first I/O pin, a latch disposed between the communicative connection between the test logic path and the first I/O pin, a second I/O pin communicatively connected to the latch, the second I/O pin operative to send a signal operative to change a state of the latch.

According to another embodiment of the present invention, a method for operating an integrated circuit chip includes sending a first signal from a first input/output (I/O) pin to a latch, the first signal operative to change a state of the latch from an open state to a closed state, and sending a second signal from a second I/O pin to a test logic path, wherein the second signal follows a conductive path through the latch in the closed state to the test logic path.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
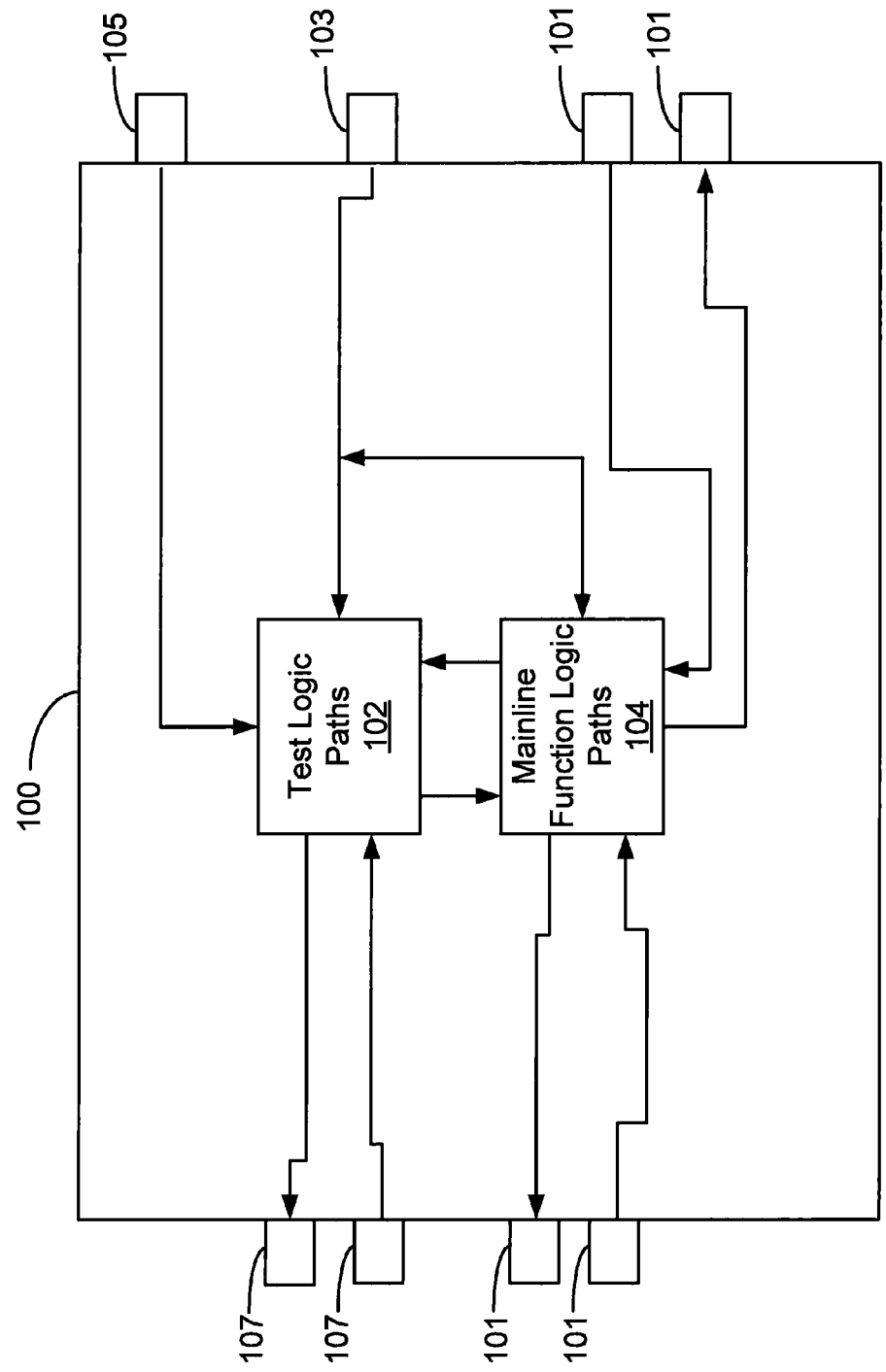
FIG. 1 illustrates a prior art example of a block diagram of an integrated circuit chip.

FIG. 1 illustrates a prior art example of a block diagram of an integrated circuit chip 100. The chip 100 includes test logic paths (structures) 102 and mainline function logic paths (structures) 104. The mainline function logic paths 104 are connected to mainline I/O pins 101 that allow input and output for main line functions. The test logic paths 102 are connected to test I/O pins (c4s) 107 and a shared test I/O pin 103 that may be used for test mode inputs and outputs. The shared test I/O pin 103 may also be used as a main line function input during mainline chip functions. A test enable pin 105 is connected to the test logic paths 102 and is used to send a test enable signal to the chip 100, placing the chip 100 in a testing mode. As discussed above, since the shared test I/O pin 103 is connected to both the test logic paths 102 and the mainline function logic paths 104, the unimpeded connection between the shared test I/O pin 103 and the test logic paths 102 and the mainline function logic paths 104 may result in undesirable logical loops that include portions of the test logic paths 102 during mainline (non-testing) chip operations.

Figure 2:
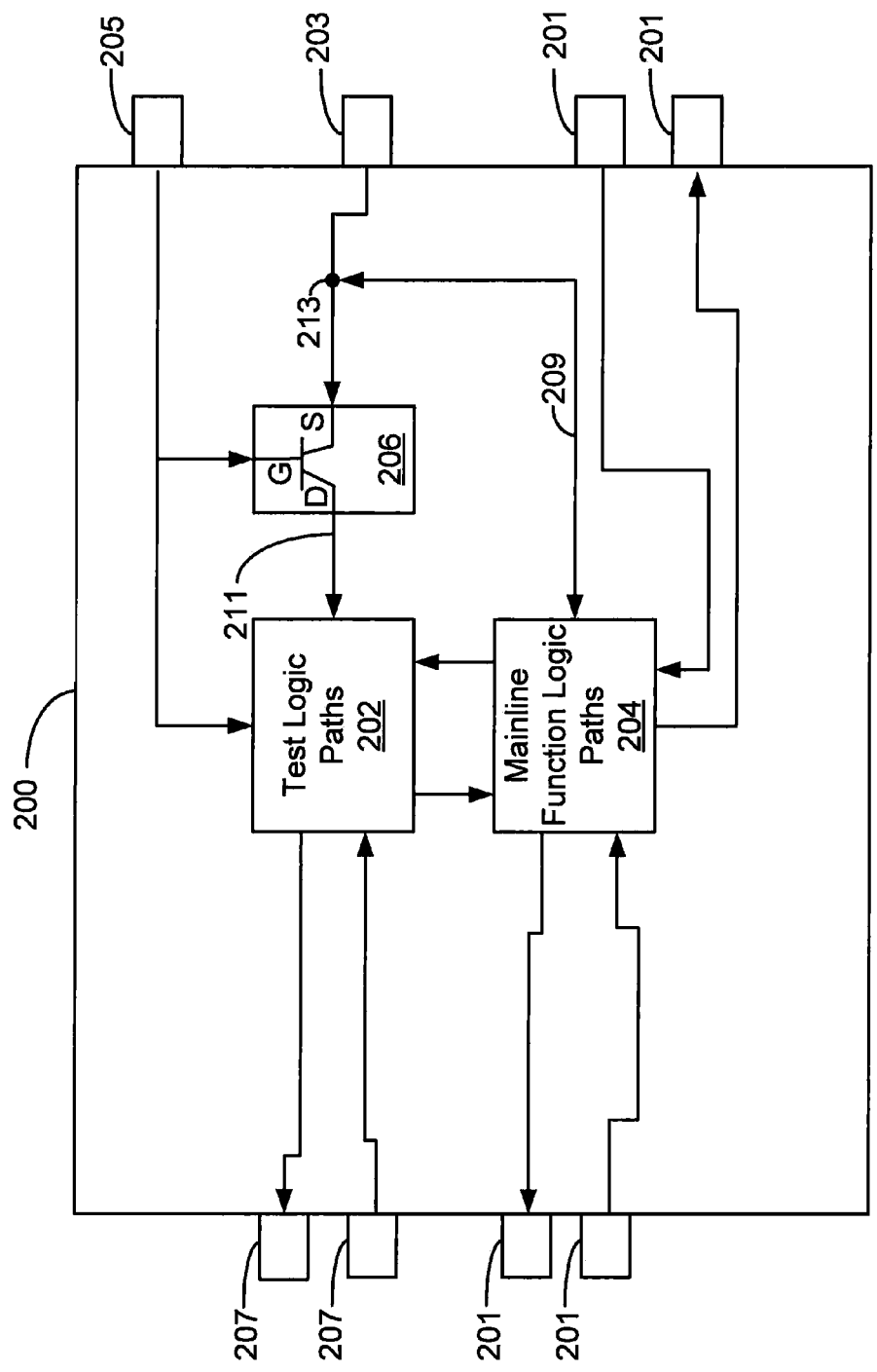
FIG. 2 illustrates a block diagram of an exemplary embodiment of an integrated circuit chip.

FIG. 2 illustrates a block diagram of an exemplary embodiment of an integrated circuit chip 200 the chip 200 includes test logic paths (structures) 202 and mainline function logic paths (structures) 204. The mainline function logic paths 204 are conductively and communicatively connected to mainline I/O pins 201 that allow input and output for main line functions. The test logic paths 202 are conductively and communicatively connected to test I/O pins (c4s) 207. A shared test I/O pin 203 is conductively and communicatively connected to the test logic paths 202 and the mainline function logic paths 204 at a node 213. A latch 206 is disposed between the shared test I/O pin 203 and the test logic paths 202. The latch 206 includes source (S), drain (D), and gate (G) terminals. The latch 206 may be, for example, a level sensitive latch that transitions and maintains a closed (pass through) state when a voltage is applied to the gate terminal, and transitions and maintains an open position when no voltage is applied to the gate terminal. In the closed state, a current may pass from the source terminal to the drain terminal. A test enable pin 205 is conductively and communicatively connected to the test logic paths 202 and is used to send a test enable signal to the test logic paths 202 that initiates and maintains a "test mode" in the chip 200. The test enable pin 205 is also conductively and communicatively connected to the gate terminal (G) latch 206 such that a signal from the test enable pin 205 may change a state of the latch 206 to a closed (pass through) state such that a signal may pass from the source terminal (S) to the drain terminal (D).

In normal mainline chip operations, the latch 206 is in an open state such that inputs and outputs from the pin 203 are only connected to the mainline function logic paths 204 via the arrow 209. In normal mainline chip operations, the chip 200 operates in a designed normal mode of operation using the mainline function logic to perform processing tasks. In a testing mode of operation, a test enable signal (e.g., a pulsed or constant direct current voltage) is applied to the test enable pin 205. The test enable signal enables the test logic paths 202 and closes the latch 206 (puts the latch 206 in a closed state). The closed latch 206 allows inputs to the test logic paths 202 from the pin 203 via the closed latch 206 and the arrow 211. Following a test operation, the test enable signal at the pin 205 is discontinued; the latch 206 opens; and the chip enters the mainline function mode.

Though the illustrated embodiment of FIG. 2 includes one shared test I/O pin 203 and latch 206 arrangement, alternate embodiments may include any number of shared test I/O pins 203 and latches arranged in a similar manner. Such an arrangement is similar to the chip 200, where the additional latches may be operated (opened and closed) by applying the test enable signal from one or more test enable pins 205.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An integrated circuit chip including:
   a mainline function logic path communicatively connected to a first input/output (I/O) pin;
   a test logic path;
   a latch disposed between the test logic path and the first I/O pin to form a communicative connection therebetween; and
   a second I/O pin communicatively connected to the latch and to the test logic path, the second I/O pin operative to send a signal operative to change a state of the latch.

2. The chip of claim 1, wherein the second I/O pin is further communicatively connected to the test logic path, and wherein the signal is further operative to initiate and maintain a test mode in the chip.

3. The chip of claim 1, wherein the signal comprises a constant direct current voltage.

4. The chip of claim 1, wherein the mainline function logic path is operative to perform normal chip logic operations.

5. The chip of claim 1, wherein the test logic path is operative to perform testing mode logic operations.

6. The chip of claim 1, wherein the latch in the open position state is operative to prevent signals from the first I/O pin from propagating in the test logic path.

7. The chip of claim 1, wherein the chip includes at least a third I/O pin communicatively connected to the mainline function logic path.

8. The chip of claim 7, wherein the chip includes at least a fourth I/O pin communicatively connected to the test logic path.

9. The chip of claim 1, wherein the mainline function logic path is separate and distinct from the test logic path.

10. A method for operating an integrated circuit chip, the method including:
    sending a first signal from a first input/output (I/O) pin to a latch and to a test logic path, the first signal operative to change a state of the latch from an open state to a closed state; and
    sending a second signal from a second I/O pin to the test logic path, wherein the second signal follows a conductive path through the latch in the closed state to the test logic path.

11. The method of claim 10, wherein the first signal is further operative to place the chip in a test mode of operation.

12. The method of claim 10, wherein the second signal is a test logic signal.

13. The method of claim 10, wherein the method further includes discontinuing the sending of the first signal, wherein the discontinuation of the sending of the first signal is operative to change the state of the latch from a closed state to an open state.

14. The method of claim 13, wherein the method further includes sending a third signal from the second I/O pin to a mainline function logic path following the discontinuation of the sending of the first signal.

15. The method of claim 13, wherein the discontinuation of the sending the first signal is operative to place the chip in a mainline logic mode of operation.

16. The method of claim 10, wherein the first signal is a direct current voltage.

* * * * *